HEAT SINK MEMBER FOR A SEMICONDUCTOR DEVICE

Filed Sept. 23, 1966 4 Sheets-Sheet 1

WITNESSES
Theodore F. Wrobel
Donald M. Winegar

INVENTORS
Alfred Meyerhoff and
John W. Motto, Jr.
BY
C. L. Menzemer
ATTORNEY

United States Patent Office 3,361,195

Patented Jan. 2, 1968

3,361,195

HEAT SINK MEMBER FOR A SEMICONDUCTOR DEVICE

Alfred Meyerhoff and John W. Motto, Jr., Greensburg, Pa., assignors to Westinghouse Electric Corporation, Pittsburgh, Pa., a corporation of Pennsylvania Filed Sept. 23, 1966, Ser. No. 581,487
14 Claims. (Cl. 165—80)

This invention relates to a liquid heat sink member for a semiconductor device.

The efficient removal of heat is one of the limiting factors in achieving the optimum current carrying capabilty of high power semiconductor devices.

Heretofore prior art devices mounted semiconductor elements on massive metal members, about which a gas or air was caused to circulate and dissipate the heat which the members absorbed from the elements during their operation. As technology progressed in developing devices with ever increasing current ratings, the heat sink member designs changed from natural convection cooling to forced air convection cooling. With the advent of devices rated at RMS current of 500 to 1000 amperes, the practical limits of forced air, or forced gas, convection cooling have reached a plateau for all practical purposes.

An object of this invention is to provide a heat sink member for semiconductor devices embodying a liquid heat exchange medium, the heat sink member having a plurality of passageways, the passageways being arranged to for one continuous serpentine path and a means for introducing the liquid heat exchange medium into one end of the serpentine path and a means for discharging the liquid heat exchange medium from the other end of the serpentine path.

Another object of this invention is to provide a heat sink member for semiconductor devices embodying a liquid heat exchange medium, the heat sink member consisting of two or more components, each component having an array of passageways contained therein, the components being so arranged that the centerline of the passageways of each component are partially off-set from each other but the cross-sectional areas of the passageways are partially co-extensive thereby providing a means for the liquid to be discharged from one passageway into one or more adjacent passageways.

Another object of this invention is to provide a heat sink member suitable for use with a semiconductor device in which passageways are arranged in a plurality of annular arrays and a liquid heat exchange medium is caused to flow in a serpentine manner in a generally radial direction within the member thereby exchanging heat between the heat sink member and the liquid medium.

Another object of this invention is to provide a heat sink member suitable for use with a semiconductor device in which a liquid heat exchange medium is circulated in a serpentine manner through a plurality of annular arrays of passsageways in a generally radial direction extending from the center of the member outwardly toward the outer periphery of the member thereby exchanging heat between said heat sink member and said liquid.

Other objects of this invention will, in part, be obvious and will, in part, appear hereinafter.

For a better understanding of the nature and objects of the present invention, reference should be had to the following detailed description and drawings, in which.

Figure 9:
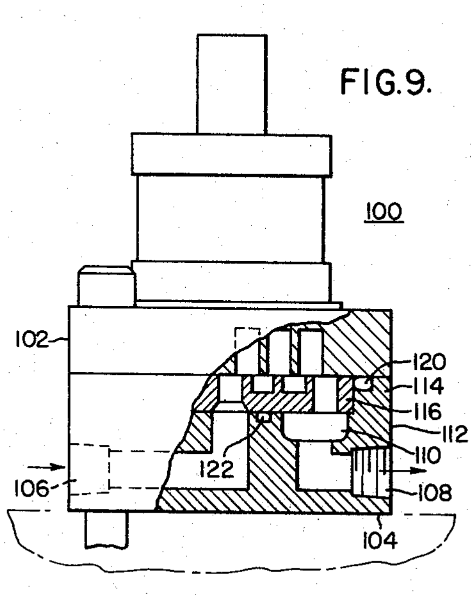
FIG. 9 is a side view, partly in cross-section, of a semiconductor device embodying the teachings of this invention.
Figure 10:
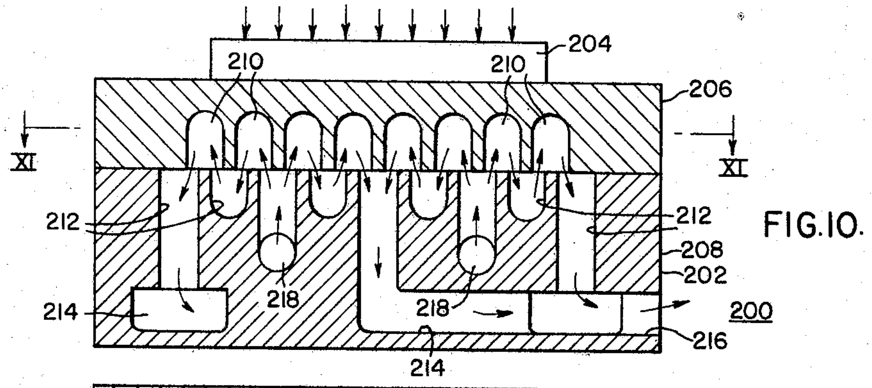
Figure 11:
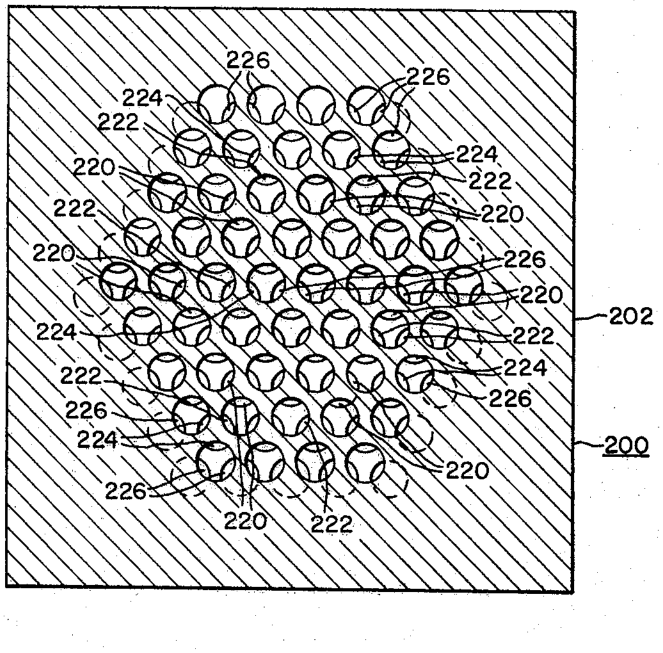
Figure 12:
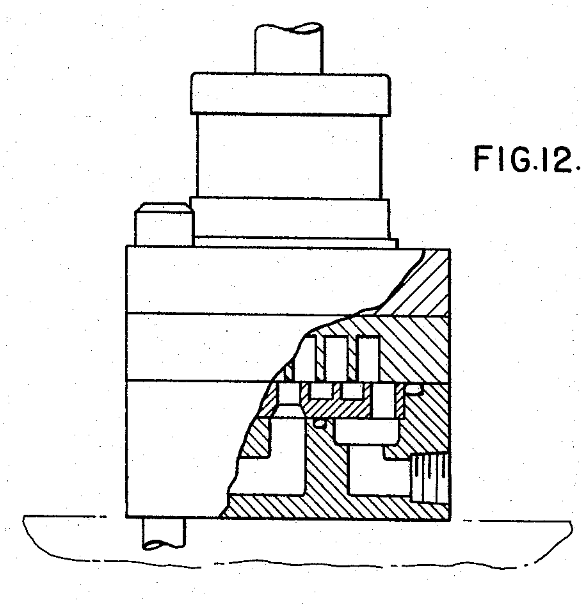

FIG. 10 s a side view, partly in cross-section, of a heat sink member made in accordance with the teachings of this invention;

FIG. 11 is a cross-sectional view of the member shown in FIG. 10 taken along the line XI—XI; and FIG. 12 is a side view (same as FIG. 9).

In accordance with the present invention and in attainment of the foregoing objects, there is provided a heat sink member suitable for use with a semiconductor device, the heat sink member having interior walls, the interior walls defining a plurality of passageways, each passageway being interconnected with at least a plurality of one other of said passageways, means for introducing a heat exchangeable fluid into the passageways, and means for discharging the fluid from the passageways.

Figure 1:
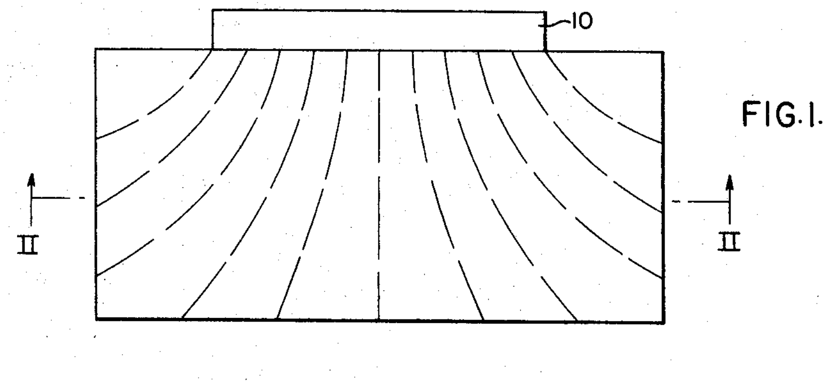
FIGURE 1 is a cross-sectional view of a heat sink member showing the flow of heat flux lines away from a heat source affixed to one surface of the member.

With reference to FIG. 1, there is shown a semiconductor element 10 mounted in a heat sink member 12 embodying the principles of heat dissipation for prior art semiconductor devices. Cooling of the member 12 by conventional air and gas circulation about the peripheral sides and edges of the member 12 causes the distribution of the heat flux lines as shown. The central portion of the member 12 has the greatest concentration of heat flux lines and therefore the greatest concentration of heat which is generated by operation of the element 10.

Figure 2:
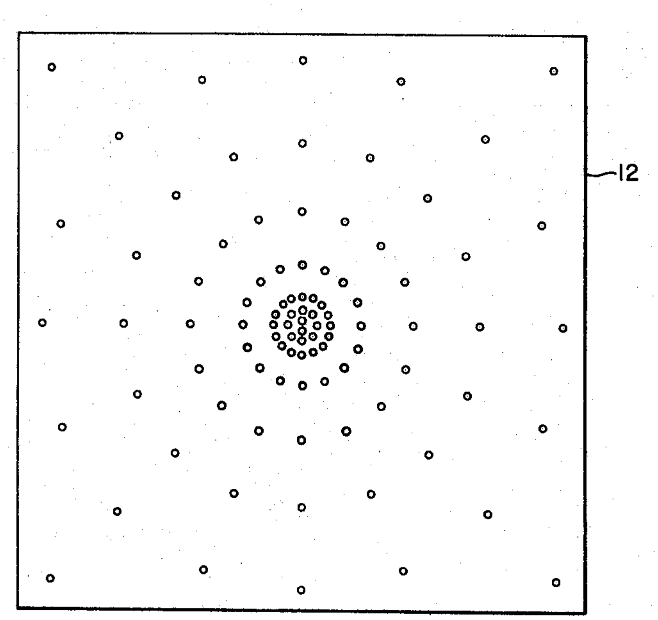
FIG. 2 is a view in cross-section of the heat sink member shown in FIG. 1 taken along the line II—II and showing the density distribution of the heat flux lines within the member.

With reference to FIG. 2 there is a view showing how the density of the heat flux lines is greatest at the center of the member 10 and density of the heat flux lines decreases radially outwardly from the center.

Therefore, if a liquid coolant were to be utilized to dissipate the heat of the member 12 generated by the operation of the element 10 it is preferred that the coolest portion of the coolant enter in the center and flow radially outwardly therefrom. As the coolant absorbs heat from the member 12, the temperature differential between the coolant and the member 12 is decreased. Therefore, to absorb the most heat possible from the member 12, the coolant as it flows radially outwardly should be in contact with the member 12 for an increasing length of time as the temperature differential decreases and should be in contact with as much surface area of the member 12 as is physically possible. The coolant should transverse as many heat flux lines as possible as it flows through the member 12 transversely to the normal heat flux lines as much as possible. The resultant flow therefore follows a serpentine path.

In arranging the passageways within the heat sink member 12 one may choose to have the axes of the passageways either vertical or horizontal to the source of the heat, the element 10, to be dissipated by the fluid heat exchange medium.

Like an electric current, the heat to be dissipated flows along the path of least resistance. When the passageways are vertical in the member 12, the thermal dissipation from the element 10 follows a relatively straight path. When the passageways are arranged horizontally in the member 12, the thermal dissipation from the element 10 must follow a more generally serpentine path which offers greater resistance to the dissipation of the heat.

Additionally, when the passageways are arranged vertically in member 12, the fluid heat exchange medium may be caused to initially flow through the center of the member 12. This is important since the center of the member 12 is also the hottest portion of the member 12.

Structurally, the distribution of passageways in a vertical manner within the member 12 makes for a stronger member 12. The application of force to the outer periphery of the member 12 by screws or clamps for instance tends to cause the member 12 to bow when the passageways are distributed horizontally in the member 12.

Distributing the passageways in a vertical manner, rather than horizontal, in the member 12 increases the theoretical active surface area of the member 12 which can be cooled by the fluid heat exchange medium within a given volume by approximately 70%. If the member 12 measures 2½" x 2½" x ½" in thickness approximately 5 holes ¼ inch in diameter can be distributed horizontally in the member 12. Vertical distribution permits approximately 41 holes, ¼ inch in diameter to be disposed in the member 12, each hole being ⅜ inch in length and reversing means connecting adjacent holes being hemispherical in shape.

Figure 3:
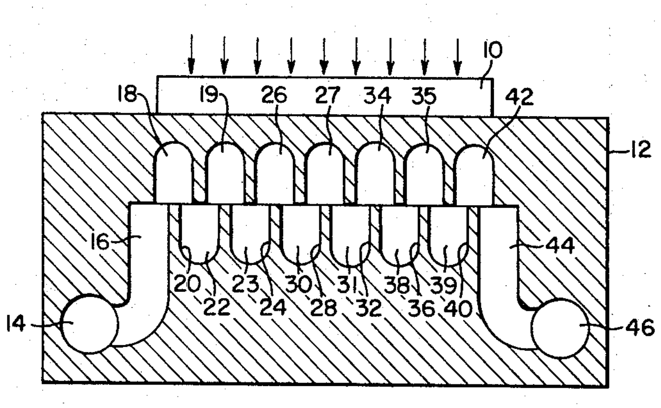
FIG. 3 is a cross-sectional view of the heat sink member shown in FIG. 2 and modified in accordance with the teachings of this invention.

With reference to FIG. 3 there is shown the member 12 after being modified in accordance with the teachings of this invention. An inlet manifold 14 causes the fluid heat exchange medium to flow into a first vertical passageway 16, thence into a passageway which forms a first reversing means 18, thence into a second vertical passageway 20 and into a second reversing means 22. The fluid continues to be directed by reversing means 22, 26, 30, 34, 38 and 42 through vertical passageways 24, 28, 32, 36, 40 and 44 into a discharge manifold 46. The fluid is forced to flow in a vertical serpentine manner through the member 12. More than one flow path consisting of the reversing means 18, 19, 22, 23, 26, 27, 30, 31, 34, 35, 38, 39 and 42 and the vertical passageways 16, 20, 24, 28, 32, 36, 40 and 44 may be disposed in the member 10, each of which is connected to the manifolds 14 and 46 which can be made common to each path.

The passageways 16, 20, 24, 28, 32, 36, 40 and 44 may be of any geometrical shape such, for example, as circular, square, rectangular, oval and the like. The reversing means 18, 22, 26, 30, 34, 38 and 42 may be conical, hemispherical and the like.

Good turbulence is achieved by forcing the liquid coolant medium to counter flow within the restricted confines of the reversing means and the passageways. This turbulence minimizes the formation of, as well as the thickness of, the stagnant film layer which always will form between a liquid coolant and the walls of the heat sink member.

Figure 4:
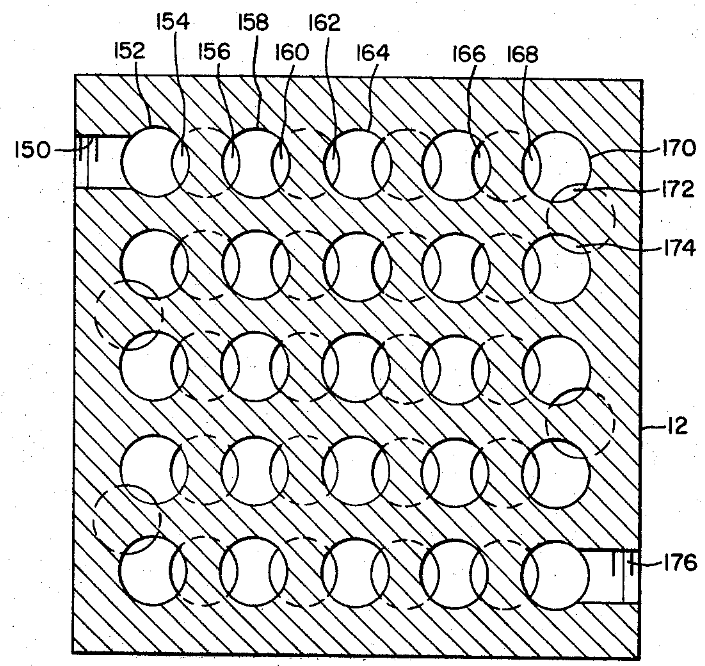
FIG. 4 is a view, partly in cross section of a heat sink member embodying the teachings of this invention.

In FIG. 4, the member 12 has been modified differently to allow the coolant to enter at one corner of the member 12 and to flow in a simultaneously vertical and horizontal serpentine manner to exit at the diagonally opposite corner.

The coolant enters the member 12 through an inlet port 150, flows upwardly through a passageway 152, exiting through a port 154 into a reversing means where the fluid flow is directed through a port 156 downwardly through a passageway 158. At the bottom of passageway 158 the coolant flow is again reversed and the coolant is forced through a port 160 through a reversing means exiting through a port 162 into a passageway 164. The flow continues through ports 164 and 166 into a passageway 170 then through a port 172 into a reversing means whereby the flow is directed through a port 174 into the next row of passageways and reversing means. The flow is continually directed up and down and back and forth within the member 12 until it leaves the member through outlet port 176.

It is to be noted that the pattern of the passageways and the reversing means can be altered by staggering the passageways and reversing means and thereby reversing the number of passageways and reversing means in the member 12.

Figure 5:
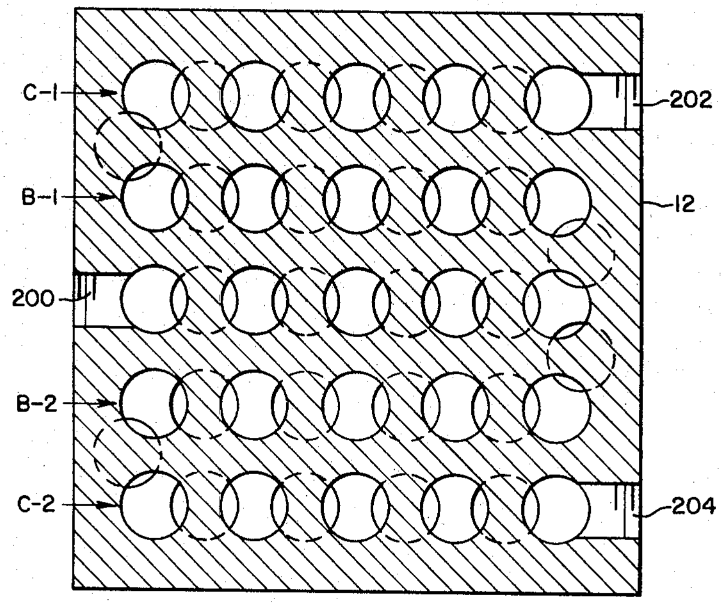
FIG. 5 is a view, partly in cross section of another heat sink member embodying the teachings of this invention.

With reference to FIG. 5 there is shown still another possible arrangement of passageways and connecting reversing means suitable for modifying the member 12.

The coolant is caused to flow in through an inlet port 200 upwardly and downwardly through a plurality of passageways and reversing means in Row A. The flow of coolant continues until it reaches the last reversing means in Row A where the flow is then diverted and directed into the plurality of passageways and reversing means in Rows B–1 and B–2. The coolant flow is then directed through the plurality of the passageways and reversing means of Row C–1 and C–2 and exits from the member 12 through the respective outlet ports 202 and 204.

Again the pattern of the passageways and reversing means can be modified to present a more compact arrangement with a greater number of passageways and reversing means by staggering their alignment in the member 12. In either case however, the flow of the coolant is vertically upward and downward and back and forth across the width of the member 12 outwardly from the central portion in at least two flow paths to two outer side peripheral portions of the member 12.

Figure 6:
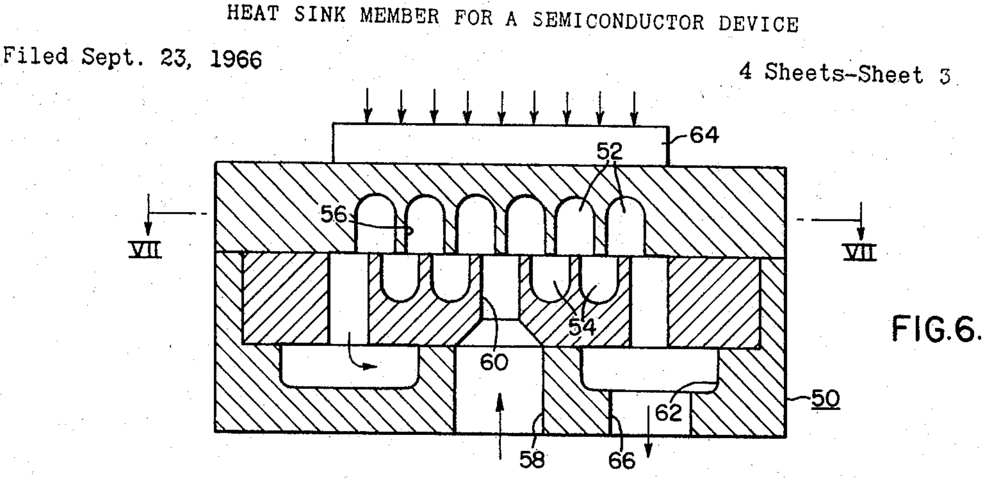
FIG. 6 is a cross-sectional view of a heat sink member made in accordance with the teachings of this invention.

With reference to FIG. 6 there is shown a heat sink member 50 in which a plurality of reversing means 52 and 54 are provided connecting a plurality of passageways 56. A coolant is caused to flow into the member 50 through an inlet port 58 and is discharged through an outlet port 66. The source of the heat to be dissipated through the coolant means is a semiconductor element 64.

The member 50 comprises an electrically and thermally conductive material such, for example, as copper, silver, aluminum and base alloys thereof.

Preferably the coolant enters through the inlet port 58 and flows through a center hole 60 into at least two or more passageways 56. Upon reaching the reversing means 52 at the end of each of these passageways 52 the coolant flow is directed from each passageway 56 through reversing means 54 into at least one or more adjacent passageways 56. The resulting flow of the coolant is very much similar to the ripples radiating outwardly from the disturbance caused when a stone is thrown into a body of water. The coolant is coldest at the point of entrance into the hottest portion of the member 50, has the greatest pressure and the greatest differential in temperature existing between the coolant and the heat sink member 50. As the coolant enters the next series of passageways 56 the same total volume of water is flowing as before although each passageway 56 has only $1/n$ portion of the volume where $n$ is the number of passageway fed by an initial center hole 60, but the pressure has dropped accordingly as well as the velocity. The coolant has absorbed heat from the portion of the member 50 which it has previously contacted and the temperature differential between the coolant and the member 50 is now less. The temperature differential also becomes less because the density of the heat flux lines becomes less as you progress radially outwardly from the center of the member 50 (see FIGS. 1 and 2). A miximum amount of heat is absorbed therefore by continually increasing the surface area contact between the coolant and the member 50 as the temperature differential between the member 50 and the coolant decreases, as the coolant flows in a serpentine fashion radially outwardly from the center of the member 50.

By proper designing of the passageways 56 and the reversing means 52 and 54 good turbulent flow of the coolant is maintained throughout the plurality of passageways 56. Consequently the thickness of a stagnant fluid film layer which always develops between the coolant and the surface of the heat sink member 50 in contact with the coolant is minimized in order to obtain the most efficient transfer of heat from the member 50 to the coolant.

Figure 7:
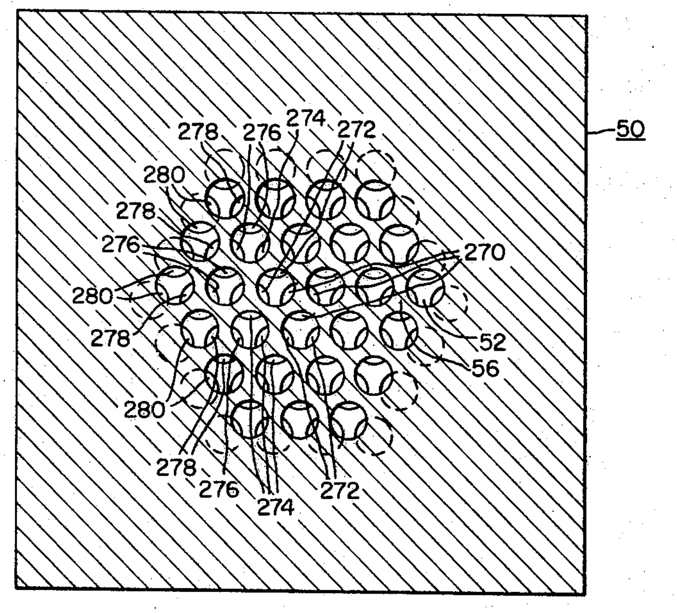
FIG. 7 is a cross-sectional view of the member shown in FIG. 6 and taken along the line V—V.

One may preferably select an overall hexagonal shaped design and distribute the passageways within the periphery of this design. One finds that the greatest number of passageways can be concentrated within the periphery of a hexagonal design than any other geometric shape of equal area. FIG. 7 shows the distribution of the passageways in the heat sink member 50.

FIG. 7 is a planar view showing the preferred distribution of the passageways and reversing means of the heat sink member 50. Referring to both FIGS. 6 and 7, it is to be noted that the coolant flows upwardly through the center hole 60 and is distributed into three upper reversing means 52 through ports 270. Upon reversing itself the coolant is then forced to flow through outlet ports 272 and into the first set of lower reversing means 54. The flow of the coolant is again reversed, turbulence naturally occurring therefore in all reversing means and is caused to flow through ports 274 into the second set of upper reversing means 52.

The flow of the coolant is again reversed and the coolant is caused to flow through ports 276 into the second set of lower reversing means 254. The flow and the coolant is again reversed, caused to flow through a plurality of ports 278 into a third set of upper reversing means 52 which again reverses the flow causing the coolant to be discharged through a plurality of ports 280 into a plurality of through holes 282 where upon the coolant discharges into the manifold 62 and exits from the member 50 through the outlet port 66.

A conventional semiconductor device can readily be converted to a fluid cooled semiconductor device through the employment of adapter units. An adapter unit serves as a center component of a three component "sandwich." The heat sink member of the original semiconductor device is modified to provide the reversing means for the plurality of passageways of the heat sink member. The third component of the "sandwich" is a prefabricated adapter containing reversing means for the passageways and manifold means for directing the flow of the coolant initially to the beginning of the plurality of passageways and again collecting the coolant after its last passage and expelling it from the device.

The components of the fluid cooled semiconductor device may be held together by two or more fastening devices ditsributed about the outer peripheral portion of the device. These fastening devices may also be employed to affix two or more coolant units to one or both sides of a bus bar. Structurally stronger with vertical flow often times, a high amperage power devices are bridged together in units of 6 rectifiers or multiples thereof for use in power drive mechanisms. The bridged coolant cooled devices may be connected in either series electrical, parallel electrical or series-parallel electrical circuits.

Figure 8:
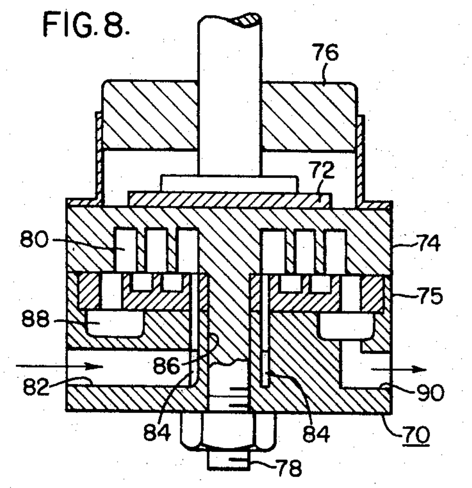
FIG. 8 is a side view of a stud mounted semiconductor device embodying the teachings of this invention.

Liquid cooled stud mounted semiconductor devices are also feasible. Reference is made to such a typical stud mounted semiconductor device 70 shown in FIG. 8. The device 70 comprises a semiconductor device 72 affixed to an electrically and thermally conductive base 74 and enclosed within a hermetic sealing means 76. The base 74 has a mounting stud 78 which enables one to assemble the device 70 in electrical equipment or to a bus bar.

The base 74 is a heat sink member which originally was a solid member but has been modified to contain a plurality of passageways 80 for directing the flow of a coolant fluid through the base 74. An adapter plate 75 cooperates with the base 74 to form a liquid cooled heat sink member. A nut 77 affixed to the mounting sheet 78 retains the base 74 and the plate 75 together. The base

74 and the adapter are electrically and thermally conductive and comprise such suitable material as copper, silver, aluminum and base alloys thereof.

The fluid coolant flows into the adapter plate 75 through an inlet port 82 and is caused to flow into a first annular manifold 84 which directs the flow into a first portion of the passageways 80. The first manifold 84 encompasses the peripheral portion of a base 86 in the adapter 85 through which the stud 88 passes.

The liquid coolant is forced to flow upwardly and downwardly radially outwardly from the manifold 84 until it is discharged into a second annular manifold from which the fluid is discharged from the adapter 75 through an outlet port 90.

The device 70 may also have a base 74 in which the passageways 80 and the manifolds 82 and 90 are cast within. Casting techniques such, for example, as the lost wax process are suitable for making a heat sink member for a semiconductor device in which the member contains the required means for circulating a liquid coolant.

In instances where the device 70 comprises a standard semiconductor device which has been modified accordingly for fluid cooling and to cooperate with adapter plates several precautions must be followed. Mating surfaces must be machined to close surface finish specifications to aid in preventing the coolant from leaking out and to provide good electrical and thermal conductivity relationship with each other. Where necessary gasketing means would aid in making the assembled components leak proofed. The adapter plate 75 may be made of a solid non-metallic material such, for example, as a suitable plastic material.

In a similar manner a fluid cooled heat sink member may be constructed for a multi-chip semiconductor device. Each chip has its own coolant system similar to that shown in FIGS. 6 and 7. The coolant system for a multichip device may also be employed with a single semiconductor element.

With reference to FIG. 10, there is shown a fluid cooled semiconductor device 200. The device 200 comprises a fluid cooled heat sink member 202 upon which is mounted a semiconductor element 204, the element 204 being the source of heat which is to be dissipated by the member 202.

Although the heat sink member 202 may be constructed as one piece having integral passages it usually comprises two or more components. The member 202 comprises a thermally and electrically conductive heat sink 206 and an adapter unit 208. The heat sink 206 comprises a material such for example as copper, aluminum, iron and base alloys thereof. The adapter unit 208 may comprise any suitable metallic or nonmetallic material.

The heat sink 206 has a plurality of blind passageways 210 contained therein. The blind or closed end of the passageways 210 provides means for reversing the flow of a fluid caused to flow in the passageways 210. The adapter unit 208 has a plurality of passageways 212 contained therein. A portion of the passageways 212 are blind and the closed end thereof provides a means for reversing the flow of a fluid passing therethrough. The remaining passageways 212 provide a means for a fluid to flow into a discharge manifold 214 and therethrough exit from the adapter unit 208 through an outlet port 216 and a means for directing a fluid through an inlet manifold 218 into selected passageways 212.

The passageways 210 and 212 are oriented with respect to each other whereby one passageway 210 overlaps a portion of one or more passageways 212.

FIG. 11 shows the patterns and the overlapping of the passageways 210 and 212. The passageways 210 and 212 are all formed parallel to the vertical axis of the heat sink member 202 and within a hexagonal shaped configuration. The passageways 210 are shown in cross-section in their entirety but only the overlapping portions of the passageways 212 are shown in cross-section.

Referring to FIGS. 10 and 11, a heat exchangeable liquid, preferably water in the instance, is caused to flow through the inlet manifold 218, through a first selected portion of the passageways 212 upwardly through a plurality of ports 220 into a first portion of the passageways 210. The flow of water is then reversed and the water flows downwardly through a plurality of ports 222 into a second selected portion of the passageways 212. The flow of the water is again reversed, and the water is caused to flow upwardly through a plurality of ports 224 into a second selected portion of the passageways 210 where the flow of water is again reversed causing the water to flow downwardly through a plurality of ports 226 into a third selected portion of the passageways 212. Some of the third selected portion of the passageways 212 are connected directly to the discharge manifold 214 and the water flowing within these passageways are discharged into the manifold 214. The remainder of the third selected portion of the passageways 212 reverse the flow of the water thereby causing it to flow upwardly through a plurality of ports 228 into a third selected portion of passageways 210 where the water flow is again reversed causing the water to flow downwardly through a plurality of passageways 230 into the third selected portion of the passageways 212 which are connected directly to the discharge manifold 214 and discharging the water therein. The water is then caused to flow within the discharge manifold 214 to the discharge port 216 where it is expelled from the heat sink member 208.

It is to be noted that the water is caused to enter the passageways 210 and 212 simultaneously at several locations intermediate between the center and the outer periphery of the heat sink member 208. The water then flows in a vertical serpentine manner in a generally radial direction outwardly from its initial entrance into the passageways 210 and 212. Additionally, the water is simultaneously flowing in a generally radial direction both towards the outer periphery of the member 208 as well as towards the center of the member 208. Some of the water from each of the smaller individual flow systems mixes with a portion of the water from the adjacent smaller individual flow system before being discharged into the manifold 214.

One of the advantages of this passageway design is that a greater surface area of contact is achieved between the heat sink member 202 and the fluid, in this instance water, when the greatest temperature differential exists. Another advantage of this passageway design is to allow the water to enter the member 202 at a maximum velocity through the plurality of ports 220 thereby achieving a higher Renolds Number and consequently a greater connection co-efficient than if the coolant medium had entered through one port only.

Although a suitable coolant to be employed in all the aforementioned liquid cooled heat sink members is water, other coolants may also be employed in lieu of the water.

The following example is illustrative of the teachings of this invention:

A thyristor unit was randomly selected from a supply of units commercially available for sale by the Westinghouse Electric Corporation as their type 224 thyristor. The thyristor had a copper square flat base heat sink member.

A flat square piece of copper, the same size as the heat sink member of the thyristor unit, was bolted to the heat sink member. A plurality of blind passageways had been drilled in the piece of copper, the passageway pattern being the same as shown in FIGS. 6 and 7.

A two component adapter was constructed for attaching to and mating with the heat sink member. The adapter was made of aluminum alloy. One component had a plurality of passageways, both blind and continuous, drilled in a pattern shown in FIGS. 6 and 7. The second component was machined to provide an inlet port an outlet port and connecting manifolds for the plurality of continuous passageways in the first component as well as providing a means for the recess mounting of the first component within the second component. The adapter was then fastened to the drilled copper plate. As assembled for testing the thyristor, the drilled copper plate and the adapter unit are shown in FIG. 12.

Water was circulated through the passageways of the drilled copper plate and the adapter unit at a flow rate of one gallon per minute. The water flowed radially outwardly in a vertical serpentine manner from the center of the plate and adapter unit and was collected by manifold connecting the outer passageways. The thermal impedance test was conducted in accordance with the procedures outlined in Part 6.206 "Thermal Resistance and Transient Thermal Resistance Test Method" established by the Joint Electronic Device Engineering Council and outlined in their test procedures "Standards For Semiconductor Thyristor."

The thermal resistance of case to water was found to be 0.156° C. per watt.

The drilled copper plate was removed from the thyristor units heat sink member. The thyristor unit's heat sink member was then drilled with the same hole patterns as the heretofore mentioned drilled copper plate. The adapter unit was then bolted to the thyristor unit, the resulting configuration was as shown in FIG. 9 and the passageway pattern was as shown in FIGS. 6 and 7.

The thermal impedance test was repeated in the exact same manner as the previous thermal impedance test. The thermal resistance of case to water was found to be 0.120° C. per watt.

The thyristor was again operated at 400 amperes and a forward drop of 2.25 volts. The water cooled heat sink member was found to have a thermal resistance of 0.120° C. per watt.

The test results obtained showed that with a water coolant flowing through the modified heat sink member of the thyristor unit in the manner heretofore described, the thermal resistance of the case to water of the heat sink member was reduced 0.036° C. per watt.

While the invention has been described with reference to particular embodiments and examples, it will be understood of course, that modifications, substitutions, and the like may be made herein without departing from its scope.

We claim as our invention:

1. A fluid cooled heat sink member suitable for use with a semiconductor device;
- said heat sink member having a plurality of interior walls;
- the interior walls defining a plurality of passageways substantially perpendicular to the mounting surface of said member and thus vertically oriented;
- each passageway being interconnected with at least two or more of said passageways;
- means for introducing a fluid into said passageways; and
- means for discharging said fluid from said passageways.

2. The heat sink member of claim 1 in which the major axis of each of the passageways is parallel to the vertical axis of said heat sink member.

3. The heat sink member of claim 2 in which the passageways are arranged in a plurality of annular arrays within a hexagonal shaped pattern; and
- the passageways are so connected as to provide a plurality of vertical serpentine fluid flow paths in a generally radial direction.

4. The heat sink member of claim 2 in which the passageways are arranged to provide a plurality of parallel serpentine paths.

5. The heat sink member of claim 2 in which the passageways are arranged to provide a continuous vertical and horizontal serpentine path.

6. The heat sink member of claim 2 in which the passageways are arranged to provide a plurality of continuous vertical and horizontal serpentine paths; and a common fluid inlet port is mutually shared by each path.

7. The heat sink member of claim 2 in which the means for introducing a fluid into said passageways is centrally located within said member; and the means for discharging said fluid from said passageways is located remote from the central portion of said member.

8. The heat sink member of claim 2 in which the means for introducing a fluid into said passageways is remotely located from the center portion of said member; and the means for discharging said fluid from said passageways is located in the center portion of said member.

9. The heat sink member of claim 2 in which the means for introducing fluid into said passageways is a plurality of ports remotely located from the center portion of said member; and the means for discharging said fluid from said passageways is partially located more remote from the center portion of said member than said fluid introducing means and partially located in the center portion of said member.

10. The liquid cooled heat sink member of claim 1 in which the heat sink member consists of two or more components;

each of said components having a plurality of interior walls, said interior walls of each component defining passageways each component being so disposed with respect to an adjoining component that the centerline of the passageways of each component are partially off-set from each other but the cross-sectional areas of the passageways are partially coextensive with each other thereby providing means for the liquid to be discharged from one passageway into one or more adjacent passageways.

11. The liquid cooled heat sink member of claim 10 in which the major axis of each of said passageways is parallel to the vertical axis of said heat sink member.

12. The liquid cooled heat sink member of claim 11 in which the means for introducing the fluid into said passageways is a plurality of ports remotely located from the center portion of said heat sink member; and the means for discharging said fluid from said passageways is partially located more remote from the center portion of said heat sink member than said fluid introducing means and partially located in the center portion of said heat sink member.

13. A semiconductor device comprising a fluid cooled heat sink member having a plurality of interior walls, the interior walls defining a plurality of passageways substantially perpendicular to the mounting surface of said member and thus vertically oriented;

each passageway being interconnected with at least two or more of said passageways;

means for introducing a fluid into said passageway;

means for discharging said fluid from said passageways; and a semiconductor element mounted on said heat sink member.

14. The semiconductor device of claim 13 in which the major axis of each of said passageways is parallel to the vertical axis of said heat sink member;

the passageways are arranged in a plurality of annular arrays within a hexagonal shaped pattern; and the passageways are so connected as to provide a plurality of vertical serpentine fluid flow paths in a generally radial direction.

References Cited

UNITED STATES PATENTS

| | | | |
|---|---|---|---|
| 1,664,628 | 4/1928 | Keasler | 165—168 |
| 1,884,612 | 10/1932 | Dinzl | 165—168 |
| 2,504,281 | 4/1950 | Spanne | 165—168 X |
| 2,699,325 | 1/1955 | Hedin | 165—168 |
| 2,912,624 | 11/1959 | Wagner | 317—100 |

FOREIGN PATENTS

| | | |
|---|---|---|
| 240,191 | 8/1962 | Australia. |
| 256,693 | 8/1926 | Great Britain. |

ROBERT A. O'LEARY, *Primary Examiner.*

A. W. DAVIS, *Assistant Examiner.*